United States Patent
Da Dalt et al.

(10) Patent No.: US 7,282,999 B2
(45) Date of Patent: Oct. 16, 2007

(54) METHOD AND DEVICE FOR GENERATING A CLOCK SIGNAL USING A PHASE DIFFERENCE SIGNAL AND A FEEDBACK SIGNAL

(75) Inventors: Nicola Da Dalt, Villach (AT); Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 37 days.

(21) Appl. No.: 11/194,770

(22) Filed: Aug. 1, 2005

(65) Prior Publication Data

US 2006/0050830 A1    Mar. 9, 2006

(30) Foreign Application Priority Data

Jul. 30, 2004    (DE) ................. 10 2004 037 162

(51) Int. Cl.
*H03L 7/085* (2006.01)
*H03L 7/087* (2006.01)

(52) U.S. Cl. .................. 331/1 A; 331/11; 331/17; 331/25

(58) Field of Classification Search ........... 331/1 A, 331/8, 10, 11, 16–18, 25; 327/156–159; 332/127; 360/51; 375/376; 455/260
See application file for complete search history.

(56) References Cited

U.S. PATENT DOCUMENTS 5,036,294 A    7/1991  McCaslin
5,488,627 A    1/1996  Hardin et al.
6,970,046 B2   11/2005 Da Dalt et al.
2005/0077969 A1  4/2005 Lalt et al.
2006/0050830 A1* 3/2006 Da Dalt et al. ............. 375/376

FOREIGN PATENT DOCUMENTS

DE        100 22 486 C1    1/2002

OTHER PUBLICATIONS

Ramezani et al., "Analysis of a Half-Rate Bang-Bang Phase-Locked-Loop", IEEE Transactions on Circuits and Systems-II: Analog and Digital Signal Processing, vol. 49, No. 7, Jul. 2002, pp. 505-509, (5 pages).
Olsson, Thomas, "A Digitally Controlled PLL for SoC Applications", IEEE Journal of Solid-State Circuits, vol. 39, No.5, May 2004, pp. 751-760, (10 pages).
Walker, R., "Designing Bang-Bang PLLs for Clock and Data Recovery in Serial Data Transmission Systems," Phase-Locking in High Performance Systems, IEEE Press, 2003, (12 pages).

* cited by examiner

*Primary Examiner*—David Mis
(74) *Attorney, Agent, or Firm*—Maginot, Moore & Beck (57) ABSTRACT

A method and a device for generating a clock signal ($F_{out}$) are provided, wherein a digital phase difference signal (X) is formed depending on a phase difference between a reference clock signal ($F_{in}$) and a feedback signal ($F_{fb}$) derived from the clock signal ($F_{out}$) and wherein the digital phase difference signal (X) is digitally filtered, in order to form a digital filtered phase difference signal (U). A digitally controlled oscillator (5) is activated by a digital control signal dependent on the digital filtered phase difference signal (U) to generate the clock signal ($F_{out}$). With a device of this kind clock signals with frequencies in the gigahertz range can be generated with a minimum of analog circuit parts.

32 Claims, 6 Drawing Sheets

METHOD AND DEVICE FOR GENERATING A CLOCK SIGNAL USING A PHASE DIFFERENCE SIGNAL AND A FEEDBACK SIGNAL

FIELD OF THE INVENTION

The present invention relates to a method and a device for generating a clock signal with the aid of a phase-locked loop (PLL). In the context of this invention a clock signal is understood to be a signal with a specific frequency, which can be used, for example, to scan data or to clock components of a circuit.

BACKGROUND

Phase-locked loops in which a clock signal is generated with a frequency which depends on a frequency of a reference signal and in particular may be a multiple of this are frequently used for generating clock signals of this kind. The reference signal can here be generated with great accuracy with a quartz oscillator, for example.

Figure 7:
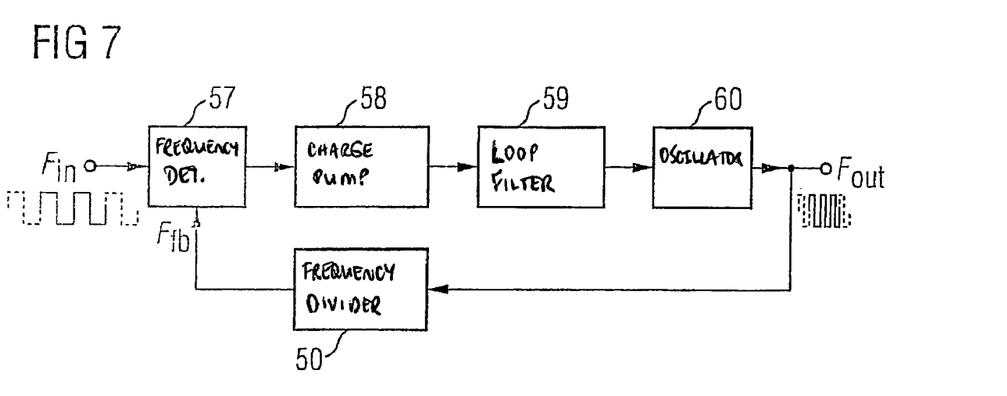
FIG. 7 shows an analog phase-locked loop according to the prior art.

In FIG. 7 a conventional phase-locked loop of this kind is shown. A reference clock signal $F_{in}$, which is generated, for example, by a quartz oscillator, and a feedback signal $F_{fb}$ are fed to a phase frequency detector 57. This activates a charge pump 58 depending on a phase and frequency difference between the reference clock signal $F_{in}$ and the feedback signal $F_{fb}$. The output signal of the charge pump 58 is filtered by a loop filter 59, for example a low-pass filter, and the signal accordingly filtered is used to activate a voltage-controlled oscillator 60, which generates a clock signal $F_{out}$ as a function of the filtered signal. The clock signal $F_{out}$ is output and additionally fed to a frequency divider 50, in order to generate the feedback signal $F_{fb}$. The frequency divider 50 divides the frequency of the clock signal $F_{out}$ by a specific factor. In this way it is achieved that the frequency of the clock signal $F_{out}$ is greater than the frequency of the reference clock signal $F_{in}$ by this specific factor.

As already initially described, the clock signals generated by phase-locked loops are used to control electronic circuits, for example in communications technology. As the circuits used there are for the most part highly integrated digital circuits, it is desirable as far as possible to dispense with analog components like the phase-locked loop illustrated in FIG. 7, in order as far as possible to be able to integrate all the parts of the circuit—for example in CMOS technology.

Figure 8:
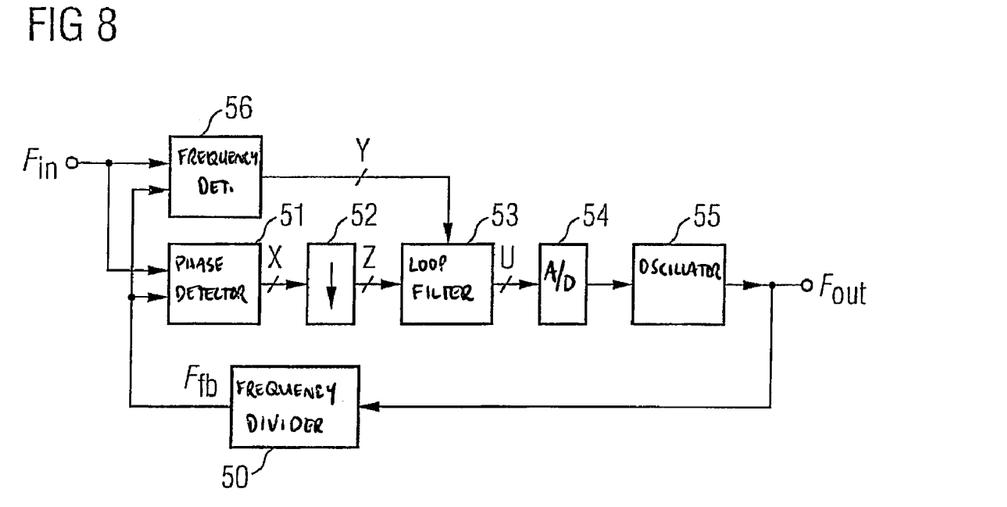
FIG. 8 shows a partially digital phase-locked loop according to the prior art.

A partially digital solution for a phase-locked loop is illustrated in FIG. 8.

In this the reference clock signal $F_{in}$ and the feedback signal $F_{fb}$, which in this case can be digital signals in each case, are fed to a digital frequency detector 56 and a digital phase detector 51. A digital or binary phase difference signal X, which is generated by the digital phase detector 51 and characterises a phase difference between the reference clock signal $F_{in}$ and the feedback signal $F_{fb}$, is fed to a serial-parallel converter or decimator 52, in order to generate a decimated phase difference signal Z. The decimated phase difference signal Z is fed together with a frequency difference signal Y, generated by the frequency detector 56 as a function of a frequency difference between the reference clock signal $F_{in}$ and the feedback signal $F_{fb}$, to a digital loop filter 53, which generates a digital corrective signal U. A digital-to-analog converter 54 generates from the digital corrective signal U an analog corrective signal with which a voltage- or current-controlled oscillator 55 is activated to generate the clock signal $F_{out}$. The clock signal $F_{out}$ is again fed to a frequency divider 50, which in the present case may additionally comprise an analog-to-digital converter to convert the analog clock signal $F_{out}$ into the digital feedback signal $F_{fb}$. A phase-locked loop of this kind can be integrated at least in its digital part. However, the digital-to-analog converter 54 provided in the phase-locked loop causes enlargement of the latency within the phase-locked loop, causing an increase in the noise of the phase-locked loop or the clock signal $F_{out}$ generated by the phase-locked loop.

SUMMARY

It is therefore the object of the present invention to provide a method or a device for generating a clock signal, wherein the method or the device can be integrated as far as possible in a digital environment and the noise of a clock signal generated is as low as possible.

This object is achieved by embodiments of the invention.

According to the invention a method for generating a clock signal is proposed, wherein a digital phase difference signal is formed depending on a phase difference between a reference clock signal and a feedback signal derived from the clock signal and wherein the digital phase difference signal is digitally filtered, in order to form a digital filtered phase difference signal. According to the invention a digitally controlled oscillator is activated by a digital control signal dependent on the digital filtered phase difference signal to generate the clock signal. With an arrangement of this kind no digital-to-analog converter is needed, thus reducing any latency of the automatic control and therefore any occurring noise. Additionally, fewer analog elements have been required than with conventional methods.

The digitally controlled oscillator can in particular be configured in such a way that a capacitance and/or inductance of an LC resonant circuit is changed depending on the digital control signal. In particular a matrix of varactor diodes can be activated to change the capacitance.

With a method of this kind or a device of this kind it is possible in particular to generate clock signals in the gigahertz range.

The feedback signal and the reference clock signal can be digital signals. The feedback signal can be generated from the clock signal by frequency division.

Furthermore, a digital frequency difference signal can be formed depending on a frequency difference between the reference clock signal and the feedback signal. This can likewise be digitally filtered, wherein in this case the digital control signal is additionally formed as a function of the filtered digital frequency difference signal, or a further digital control signal can be formed to activate the digitally controlled oscillator as a function of the digital frequency difference signal. The further digital control signal can in this case correspond in particular to the digital frequency difference signal.

Additionally, means for modulating a frequency of the clock signal may be provided, for example by modulating the digital control signal or the further digital control signal. Modulation of this kind, which is typically done with a considerably smaller frequency than a frequency of the clock signal and modulates the frequency of the clock signal in the order of magnitude of 0.5%, serves to reduce electromagnetic interferences (EMI). This method is designated as "spread spectrum clocking" (SSC) and is explained in greater detail in U.S. Pat. No. 5,488,627.

The digital phase difference signal can be filtered by a digital filter which has a proportional and an integral component, wherein weighting factors for the proportional and integral components may be settable. The proportional component of the digital filtered phase difference signal can also be fed to the digitally controlled oscillator as a separate control signal, further reducing any latency of the automatic control and enabling quick tracking of the phase control.

It is conceivable to execute the signal processing at least partially with signals the frequency of which has been lowered, in order thus to enable a simpler implementation, as in this case circuit sections of a device according to the invention for executing the method according to the invention can be operated with a lower clock frequency. For example, a clock frequency of the digital phase difference signal can be decreased and generation of the digital control signal correspondingly executed with a lower frequency. This lowering of the frequency can also optionally be done as a function of a frequency of the reference clock signal.

Components for determining the phase difference and for filtering the phase difference signal and the digitally controlled oscillator can be clocked by an internal clock signal dependent on the reference clock signal or an internal clock signal dependent on the clock signal. In the first alternative a clock signal is output with a frequency which remains constant if the reference clock signal fails, whereas in the second case output no longer takes place.

The digital phase difference signal may be a signal with only two states, generated by a binary phase detector. Correspondingly, the digital frequency difference signal may be a signal with only two states.

BRIEF DESCRIPTION OF THE DRAWINGS

The invention is explained in greater detail below with reference to the attached drawings using preferred embodiment examples.

DETAILED DESCRIPTION

Figure 1:
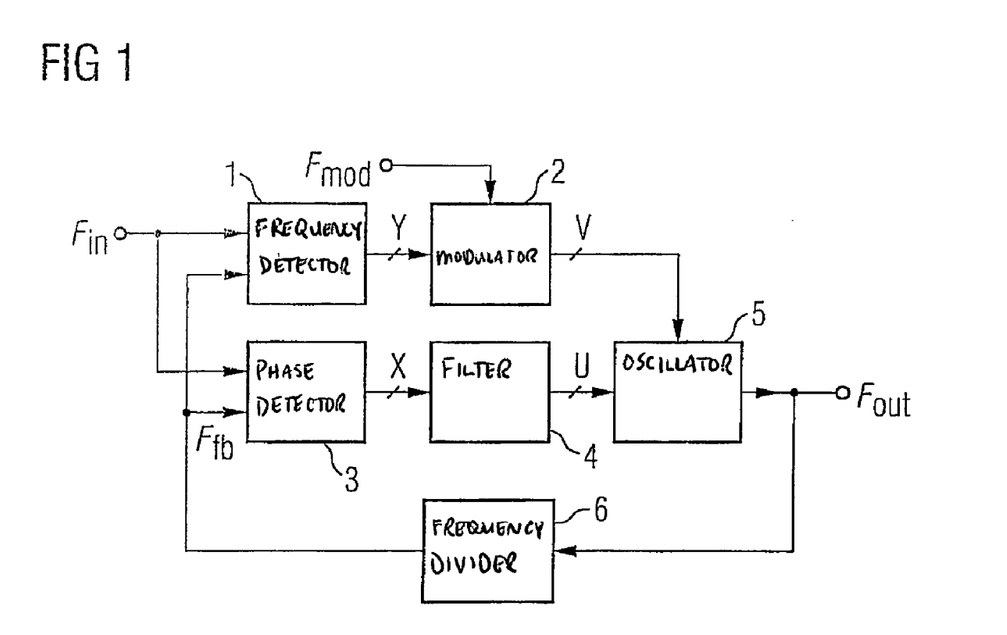
FIG. 1 shows a block diagram of a first embodiment example of the present invention.

In FIG. 1 a block diagram of a first embodiment example of the present invention is illustrated. In the device illustrated a reference clock signal $F_{in}$ and a feedback signal $F_{fb}$ are fed in each case to a digital frequency detector 1 and a digital phase detector 3. The reference clock signal $F_{in}$ has a preset frequency and can be generated, for example, in a known manner with a quartz oscillator (not illustrated). The digital feedback signal $F_{fb}$ is generated by means of a frequency divider 6 from a clock signal $F_{out}$ output by the device. The feedback signal $F_{fb}$ in particular may have a frequency which is lower than a frequency of the clock signal $F_{out}$ by a preset factor. If the clock signal $F_{out}$ is an analog signal, the frequency divider 6 additionally comprises analog-to-digital conversion elements to generate the digital feedback signal $F_{fb}$.

The frequency detector 1 generates a digital frequency difference signal Y, which indicates a frequency difference between the frequency of the reference clock signal $F_{in}$ and the frequency of the feedback signal $F_{fb}$. The phase detector 3 correspondingly generates a digital phase difference signal X, which indicates a phase difference between the reference clock signal $F_{in}$ and the feedback signal $F_{fb}$. The frequency difference signal Y is fed to a modulation device 2, which generates a frequency difference signal V modulated with the frequency of a modulation signal $F_{mod}$. This serves for the ultimate generation of a clock signal $F_{out}$ which has a minimal modulation of its frequency, so-called "spread spectrum clocking" (SSC). This technique, the principle of which is described more precisely in U.S. Pat. No. 5,488,627, serves to reduce electromagnetic indifferences (EMI). The clock signal $F_{out}$, which can have frequencies in the gigahertz range, is in this case modulated in such a way that with a frequency of approximately 30 KHz its frequency differs by approximately 0.5% from its nominal frequency. Because of the modulation device 2 this additional modulation can be controlled by means of the modulation signal $F_{mod}$, which can in particular also be used for testing purposes. In principle, however, the reference clock signal $F_{in}$ can also already be appropriately modulated, wherein in this case the phase-locked loop illustrated in FIG. 1 has to be configured in such a way that this modulation is "passed on".

The modulated frequency difference signal V is then fed to a first control input of a digitally controlled oscillator 5.

The frequency difference signal X is fed to a digital loop filter 4, for example a proportional-integral filter (PI filter). The thus filtered phase difference signal U is fed to a second control input of the digitally controlled oscillator 5. The digitally controlled oscillator 5 then generates the clock signal $F_{out}$ with a frequency determined by the modulated frequency difference signal V and the filtered phase difference signal U. In this way it is achieved that in the adjusted state the clock signal $F_{out}$ has a frequency which is greater than the frequency of the reference clock signal $F_{in}$ by the specific factor of the frequency divider 6.

As the filtered phase difference signal U and the modulated frequency difference signal V serve directly to activate the digitally controlled oscillator 5, no digital-to-analog converter is needed. In this way a shorter latency in the phase-locked loop and thus also less noise of the generated clock signal $F_{out}$ is achieved. In that the modulated phase difference signal V is fed to the digitally controlled oscillator 5 directly at a separate control input, if there are greater frequency deviations quick automatic control into the range of the "correct" frequency is possible, resulting in quick adjustment of the phase-locked loop.

Figure 2:
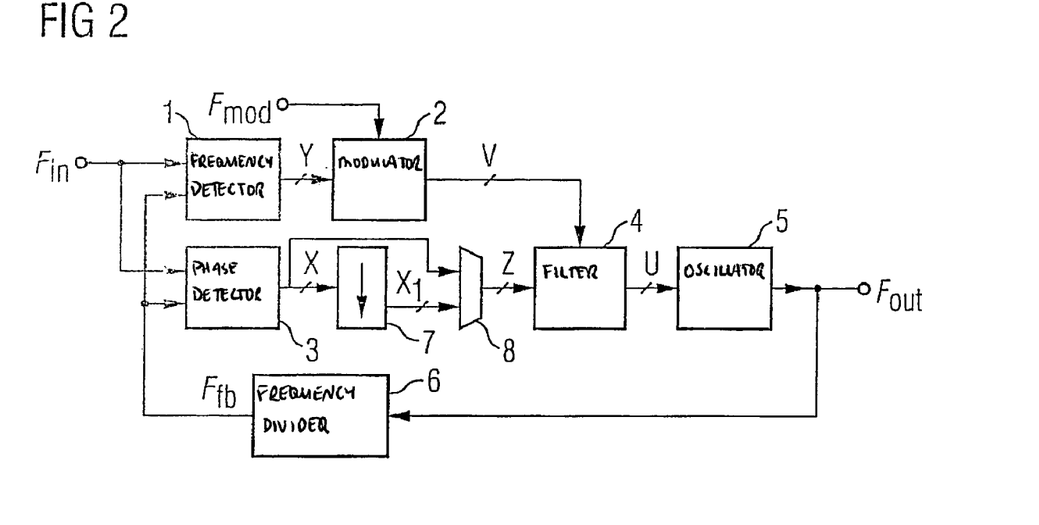
FIG. 2 shows a block diagram of a second embodiment example of the present invention.

In FIG. 2 a block diagram of a second embodiment example of the present invention is illustrated. The phase-locked loop illustrated in FIG. 2 coincides in many aspects with the phase-locked loop from FIG. 1 and identical or equivalent elements are characterised by the same reference symbols. Therefore only the differences from the phase-locked loop from FIG. 1 are explained below, so as to avoid repetitions.

Additionally to the elements already described with reference to FIG. 1, the phase-locked loop from FIG. 2 comprises a decimator 7 and a multiplexer 8, arranged between the phase detector 3 and the digital loop filter 4, as illustrated in FIG. 2. Phase difference signal X is fed to the decimator 7, which generates from it a decimated phase difference signal X1. This has in particular a lower scanning rate compared with phase difference signal X. By means of the multiplexer 8 it is possible to select whether the phase difference signal X or the decimated phase difference signal X1 is fed to the digital loop filter 4 as phase difference signal Z. Choosing the decimated phase difference signal X1 as phase difference signal Z is sensible in particular if the frequency of the reference clock signal $F_{in}$ is very large, as then because of the decimation the digital loop filter 4 has to operate only at a lower clock frequency, simplifying the implementation. With lower frequencies of the reference clock signal $F_{in}$ phase difference signal X can be used as phase difference signal Z. It should be noted that if the frequency of the clock signal $F_{out}$ remains constant a lower frequency of the reference clock signal $F_{in}$ causes a higher specific factor of the frequency divider 6 and a higher frequency of the reference clock signal $F_{in}$ causes a lower specific factor of the frequency divider 6.

As a further modification compared with FIG. 1, the frequency difference signal V is likewise fed to the digital loop filter 4 and the signal U is generated as a function of both the phase difference signal Z and the frequency difference signal V. In this case the digitally controlled oscillator 5 requires only one control input. However, in reverse the automatic control in the case of larger frequency deviations between the reference clock signal $F_{in}$ and the clock signal $F_{out}$ is slightly slower than in the embodiment example of FIG. 1.

It should also be noted that the two above-described modifications compared with FIG. 1 can be implemented independently of one another.

Figure 3:
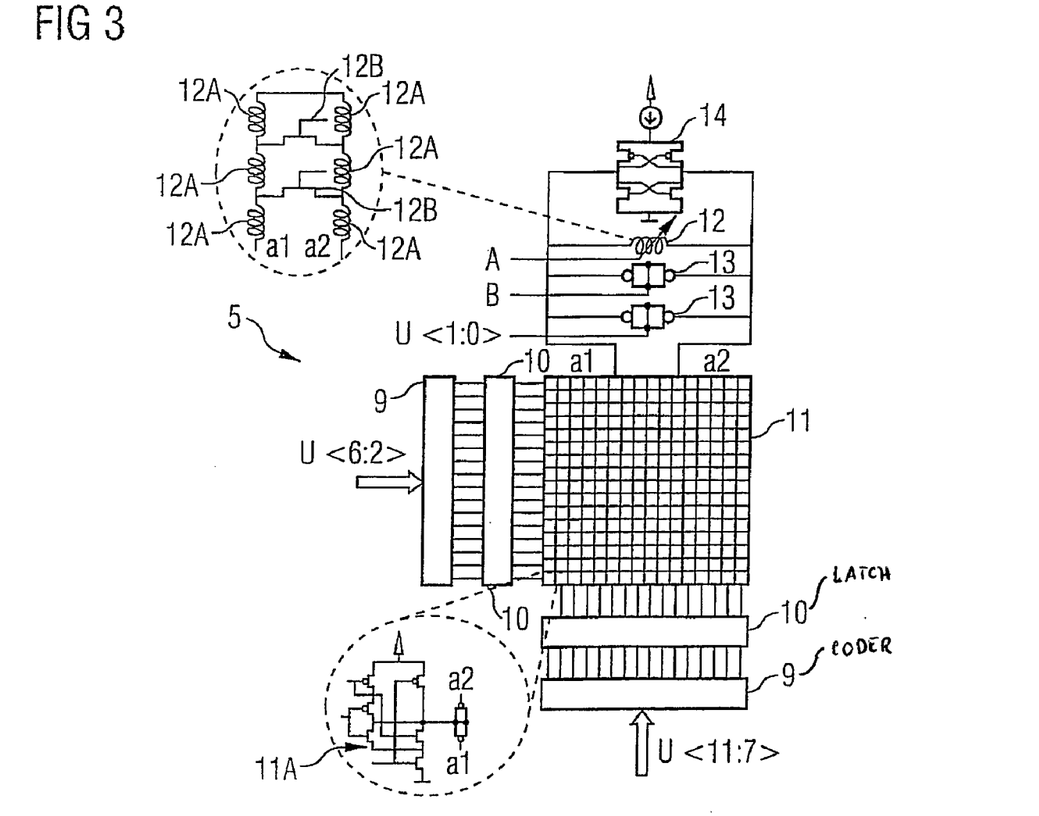
FIG. 3 shows a block diagram of a digitally controlled oscillator which can be used in the embodiment examples of FIG. 1 and FIG. 2.

In FIG. 3 a possible structure of the digitally controlled oscillator 5 from FIGS. 1 and 2 is illustrated schematically. In the digitally controlled oscillator illustrated it is assumed that this is fed a single control signal U as in FIG. 2, which as an example is to have a width of 12 bits. In the example illustrated the individual bits are numbered consecutively from 0 to 11, 0 being the number of the lowest-value bit and 11 the number of the highest-value bit.

A resonant circuit consisting substantially of an inductance 12 and capacitances 11 and 13 serves to generate the output clock signal.

In the example illustrated bits 2 to 6 and bits 7 to 11 are fed separately in each case to thermometer coders 9, which generate a thermometer code corresponding to the binary code fed in each case. This thermometer code is intermediately stored in each case in a latch 10 in order to compensate for differences in the transit times in the thermometer coders 9. According to the output signals of the latches 10, a matrix 11 of varactors 11A is activated, in other words the varactors are activated or deactivated corresponding to the signals output by the latches 10, thereby changing the overall capacitance of the resonant circuit. A possible structure of the individual varactors 11A consisting of transistors is illustrated enlarged in FIG. 3, the outputs a1, a2 of the varactors being interconnected to the corresponding lines a1, a2 of the resonant circuit. As in principle any switchable capacitances can be used in this case, the precise structure of the varactors 11A will not be explained in greater detail here.

The two lowest-value bits 0 and 1 of the signal U directly activate two binary weighted varactors 13.

Thus, overall, by changing the signal U a change in the capacitance of the resonant circuit of the digitally controlled oscillator 5 and thus a change in the frequency of the output signal $F_{out}$ is possible.

Furthermore, initialisation signals A and B can be fed to the digitally controlled oscillator 5 from FIG. 3. Initialisation signal B in this case controls further varactor diodes 13, while the control signal A serves to set the inductance. By means of control signals A and B a frequency range can therefore be selected in which the digitally controlled oscillator 5 operates. This can be done, for example, as a function of the frequency of the reference clock signal $F_{in}$.

The structure of the inductance 12 is illustrated in an enlarged detail. In the example illustrated the inductance 12 comprises six individual inductances 12A and two switches 12B configured as transistors, which are switched as a function of initialisation signal A, thereby changing the overall inductance of the arrangement.

With an oscillator of this kind, in connection with the embodiment examples from FIG. 1 and FIG. 2 it is in particular possible to achieve clock signals $F_{out}$ with frequencies in the gigahertz range, for example between 1 and 5 GHz.

Next the structure of further blocks from FIGS. 1 and 2 will be explained together with further features of the invention using detailed block diagrams of further embodiment examples.

Figure 4:
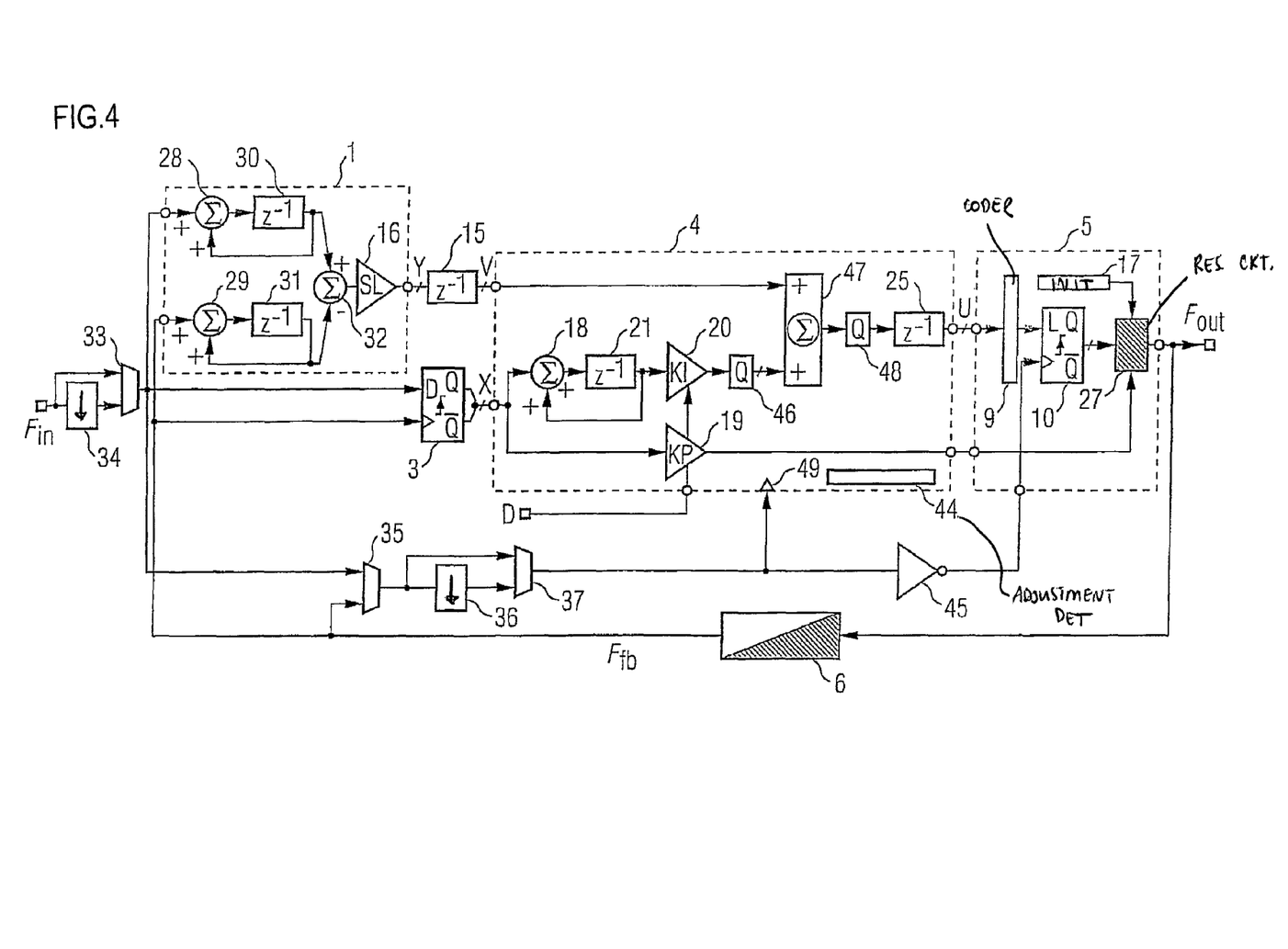
FIG. 4 shows a detailed block diagram of a third embodiment example of the present invention.

In FIG. 4 a detailed block diagram of a further embodiment example is illustrated. The reference clock signal $F_{in}$ is fed in parallel to a decimator 34 and a multiplexer 33. The output signal of decimator 34 is likewise fed to multiplexer 33. Decimator 34 and multiplexer 33 substantially fulfil the same function as decimator 7 and multiplexer 8 from FIG. 2, in other words at a high frequency of the reference clock signal $F_{in}$, by appropriate activation of the multiplexer 33 a decimated signal with a lower scanning rate can be used for processing in the phase-locked loop. This—as already described with reference to FIG. 2—can simplify the implementation of the various blocks.

Sometimes in this case the specific factor of the frequency divider 6 has to be correspondingly adapted to obtain the desired frequency of the clock signal $F_{out}$.

The reference clock signal $F_{in}$ or the correspondingly decimated reference clock signal and also the feedback signal $F_{fb}$ are fed to a frequency detector 1. This comprises two integrators, the reference clock signal being fed to a first integrator, constructed, as illustrated, of a summator 28 and a delay element 30, while the feedback signal is fed to a second integrator, formed of a summator 29 and a delay element 31. The first integrator and the second integrator, as it were, "count" the number of rising edges of the signal fed to them in each case.

The output signal of the second integrator is subtracted from the output signal of the first integrator in a subtractor 32. This gives rise to a positive value if the reference clock signal has more rising edges, in other words has a higher frequency, while a negative value arises if the feedback signal $F_{fb}$ has a larger number of rising edges, in other words has a higher frequency. The output signal of the subtractor 32 is thus a measure for the frequency difference between the input clock signal $F_{in}$ and the feedback signal $F_{fb}$. This signal is also weighted in a multiplier 16 with a weighting factor SL, in order to form a frequency difference signal Y. The frequency difference signal Y is fed to a delaying device 15, which delays the signal fed to it by one clock, in order to form a phase difference signal V, which is fed to a loop filter 4.

The delaying device 15 is necessary in particular to feed the frequency difference signal to the loop filter 4 synchronously with a phase difference signal X, the phase difference signal X being generated by a phase detector 3, to which again the reference clock signal (or the decimated reference clock signal) $F_{in}$ and the feedback signal $F_{fb}$ are fed. The phase detector 3 is constructed as a flip-flop or latch, which scans the reference clock signal $F_{in}$ on rising edges of the feedback signal $F_{fb}$. An output Q and an inverted output $\overline{Q}$ of the phase detector 3 are interconnected. This generates a phase difference signal X which can adopt two values, +1 or −1, depending on whether the phase of the reference clock signal $F_{in}$ or the phase of the feedback signal $F_{fb}$ is leading. Owing to the two possible output states this is also referred to as a binary phase detector and a phase-locked loop using a phase detector of this kind is also designated as a "bang-bang PLL" (BBPLL). BBPLLs of this kind are described, for example, in R. Walker "Designing Bang-Bang PLLs for Clock and Data Recovery in Serial Data Transmission Systems", Phase-Locking in High Performance Systems, IEEE Press, 2003.

Next the digital loop filter 4 will now be described. In the digital loop filter 4 the phase difference signal X is fed to a third integrator, formed by a summator 18 and a delay element 21. This integral component is multiplied in a multiplier 20 by a weighting factor KI. Furthermore, the phase difference signal X is multiplied in a multiplier 19 by a weighting factor KP, in order to form a proportional component. This proportional component is fed directly to a digitally controlled oscillator 5. The weighting factors KP and KI can be set by a control signal D, in order to generate a desired behaviour of the digital loop filter 4. The integral component, in other words the output of the multiplier 20, is fed to a truncator 46, which truncates the lowest-value bits of the integral component in order to match a bit width of the integral component to a bit width of the frequency difference signal V. Noise in the integral component is additionally reduced by this truncation. The thus "truncated" integral component is added to the frequency difference signal V in a summator 47 and fed to a further truncator 48, which again truncates the lowest-value bits. Truncator 28 is followed by a delay element 25 which represents a delay in the processing and the output of which is a control signal U for the digitally controlled oscillator 5. The digitally controlled oscillator 5 from FIG. 4 substantially corresponds to that described with reference to FIG. 3 and is illustrated as simplified compared with it. In particular only one thermometer coder 9 and one latch 10 are provided for intermediate storage, this illustration substantially serving the purpose of simplification. In the actual oscillator block 27 the matrix of varactors 11, the further varactors 13, the inductance 12 and the circuit for the power supply 14 from FIG. 3 are appropriately combined.

The initialisation control signals A and B from FIG. 3 are generated by an initialisation circuit 17.

At a further input the resonant circuit 27 is directly activated by the proportional component of the digital loop filter 4. This can correspond, for example, to the two lowest-value bits of the signal U from FIG. 3, or a further varactor diode 13 may be provided for this activation. Because of this direct activation the automatic control takes place more quickly with a lower latency, as the summator 47, the truncator 48 and the delay element 25 are "bypassed".

The resonant circuit 27 then, as already described, generates the clock signal $F_{out}$, which is looped back via a frequency divider 6 to the input of the phase-locked loop.

Furthermore, in the phase-locked loop from FIG. 4 adjustment detection 44—here inside the digital loop filter 4—is provided, which identifies whether the phase-locked loop has been adjusted. This can be done, for example, by checking whether the signal U remains constant. If the phase-locked loop has been adjusted, the adjustment detection 44 can, for example, send a signal to circuit parts which use the clock signal $F_{out}$.

Moreover, in FIG. 4 a circuit section is provided which supplies the digital loop filter 4 and the latch 10 with an internal clock signal. This circuit section comprises a multiplexer 35, a decimator 36 and a multiplexer 37. With multiplexer 35 a selection is made as to whether the reference clock signal $F_{in}$ or the feedback signal $F_{fb}$ should be used as internal clock signal for clocking the digital loop filter 4 and the latch 10 and therefore the digitally controlled oscillator 5. Decimator 36 and multiplexer 37 have substantially the same function as decimator 34 and multiplexer 33, in other words they substantially enable the digital loop filter 4 and the digitally controlled oscillator 5 to be operated with a lower clock rate. The clock signal generated with the circuit section 35, 36, 37 is then fed to a clock input 49 of the digital loop filter 4 and via an inverter 45 to a clock input of the latch 10.

If the reference clock signal $F_{in}$ is used for clocking the digital loop filter 4 and the latch 10, the effect of this is that, if the reference clock signal $F_{in}$ fails, the output of the latch 10 and the digital loop filter 4 and thus the output of the resonant circuit 27 remain constant and a usable clock signal $F_{out}$ therefore continues to be output. In this case circuit parts positioned downstream can therefore continue to operate if, for example, there is a short-term failure of the reference clock signal $F_{in}$.

If, on the other hand, the feedback signal $F_{fb}$ is used as clock signal for the digital loop filter 4 and the latch 10, this is not the case and this operating mode can be used, as it were, for automaticaly switching off the output clock signal $F_{out}$ if the reference clock signal $F_{in}$ fails.

In respect of the multiplexers 33, 35 and 37 and the decimators 34 and 36 it should be noted that various operating modes are made possible by providing multiplexers and thus flexible use of the phase-locked loop is made possible for various applications. If, however, the phase-locked loop is provided for a fixed application with a fixed frequency, naturally only the relevantly desired paths have to be provided and the switchover option by the multiplexer can be omitted.

Figure 5:
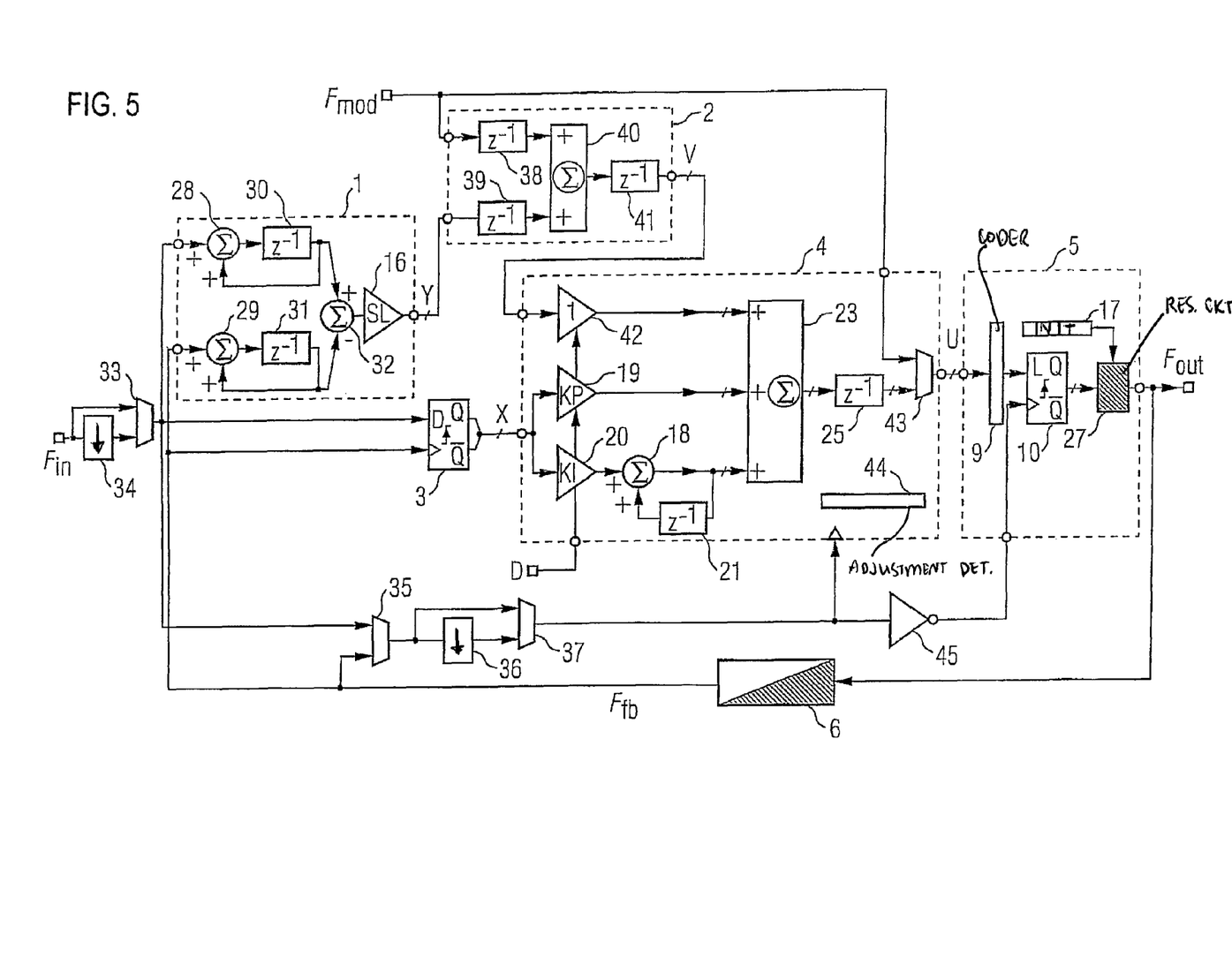
FIG. 5 shows a detailed block diagram of a fourth embodiment example of the present invention.

In FIG. 5 a modification of the circuit arrangement illustrated in FIG. 4 is illustrated. To avoid repetitions, only the differences from the phase-locked loop illustrated in FIG. 4 are explained below.

Additionally to the elements present in the phase-locked loop of FIG. 4, the phase-locked loop from FIG. 5 comprises a modulator 2 which corresponds in its function to modulator 2 from FIGS. 1 and 2. The frequency difference signal y generated by the frequency detector 1 and a modulation signal $F_{mod}$ are fed to the modulator 2. The already described SSC modulation of the clock signal $F_{out}$ can be achieved by means of the modulator 2. The modulation signal $F_{mod}$ is fed to a delay element 38, while the frequency difference signal is fed to a delay element 39. The outputs of delay elements 38 and 39 are added up in a summator 40 and at the same time, as illustrated by delay element 41, again delayed by one clock. This gives rise to a modulated frequency difference signal V, which is ultimately to a modulated signal U, with which the digitally controlled oscillator 5 is activated, thereby achieving the desired modulation of the clock signal $F_{out}$. Here too the delay elements symbolize the time taken for processing.

As a further modification to the phase-locked loop from FIG. 4, both the integral component of the filtered phase difference signal X and the proportional component are added to the modulated frequency difference signal V in the summator 23, so in this case the proportional component is not directly passed to the resonant circuit 27.

Furthermore, a multiplier 42 controllable by the control signal D is provided, with which a weighting factor of the modulated frequency difference signal can be set.

As another further modification, the order of the multiplier 20 and the integrator formed by the summator 18 and the delay element 21 is transposed, in order to show that the weighting can be performed both in front of and behind the integrator. Finally, no truncators 46, 48 are present.

Because of the summation of both the proportional and the integral components with the frequency difference signal V in the summator 23 only one single control input of the digitally controlled oscillator 5 is necessary.

Finally, for testing purposes a multiplexer 43 is provided, via which the signal $F_{mod}$ can be directly forwarded as control signal U for the digitally controlled oscillator 5.

The described modifications to the phase-locked loop of FIG. 3 are substantially independent of one another and can also be implemented individually according to need.

Figure 6:
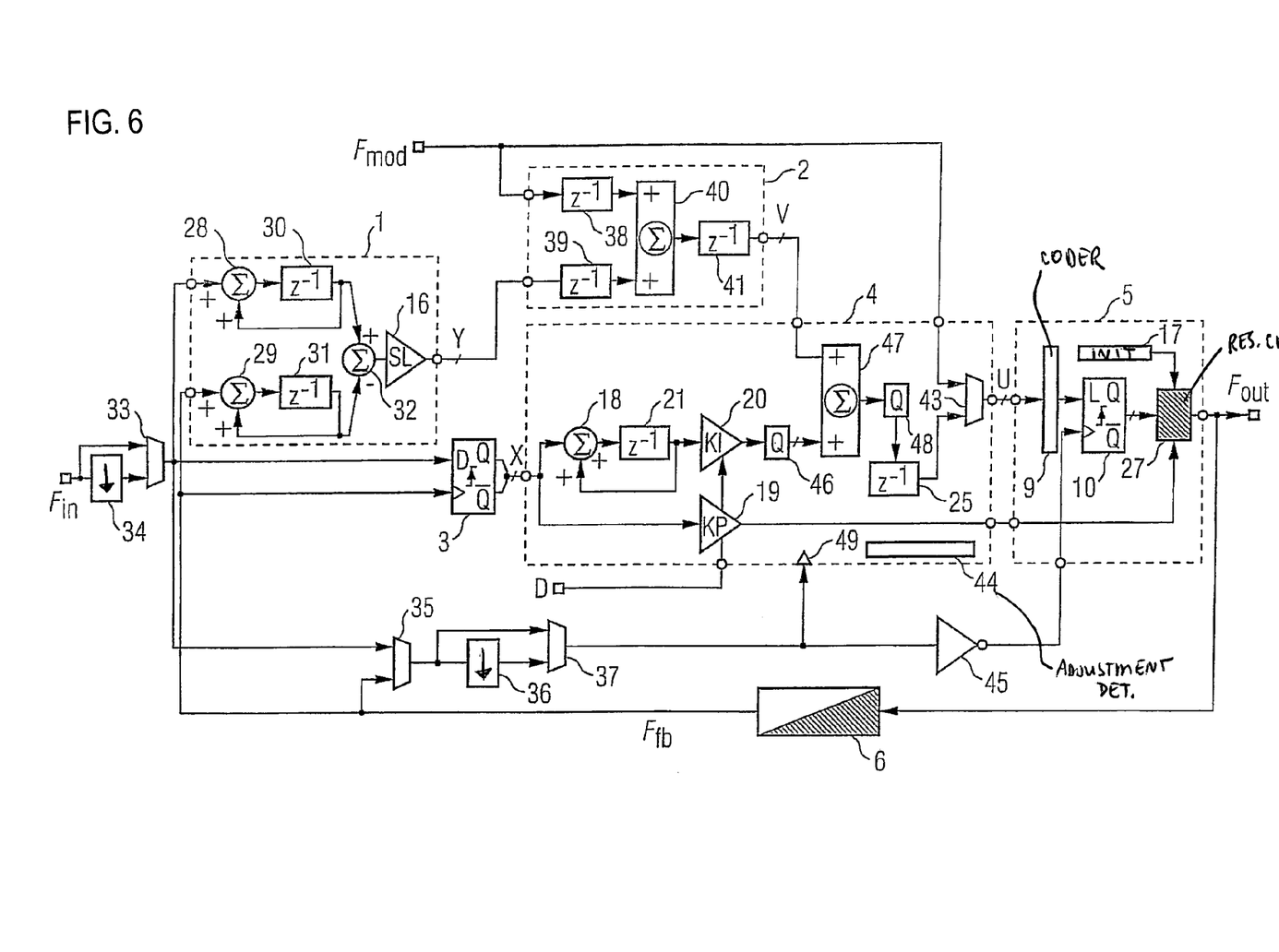
FIG. 6 shows a detailed block diagram of a fifth embodiment example of the present invention.

This is the case, for example, in the third embodiment example of a phase-locked loop according to the invention shown in FIG. 6. By comparison with FIG. 4, here only the delay element 15 has been replaced by the modulator 2 from FIG. 5 and the multiplexer 43 from FIG. 5 added. Otherwise the structure of the phase-locked loop corresponds to the structure from FIG. 4. In particular the proportional component of the filtered frequency difference signal X is fed directly to the resonant circuit 27 for control thereof.

In the embodiment examples of FIGS. 4 to 6 only the elements illustrated in grey are analog elements, in other words the resonant circuit 27 and an analog part of the frequency divider 6. Otherwise the implementation is fully digital, signifying a simpler embodiment in CMOS technology and entailing greater flexibility. On the other hand it is possible to generate high frequencies in the gigahertz range with low noise.

Naturally other implementations, in particular of the frequency detector 1, the modulator 2, the phase detector 3, the digital loop filter 4 and the digitally controlled oscillator 5, from those shown in FIGS. 4 to 6 are possible. However, the embodiment examples shown illustrate an implementation which can be carried out with relatively little outlay and which leads to a low-noise phase-locked loop.

The invention claimed is:

1. A method for generating a clock signal, comprising:
    a) forming a phase difference signal based at least in part on a phase difference between a digital reference clock signal and a digital feedback signal derived from the clock signal;
    b) digitally filtering the phase difference signal in order to form a filtered phase difference signal, and
    c) controlling a digitally controlled oscillator to generate the clock signal at least in part using a digital control signal, the digital control signal dependent on the filtered phase difference signal.

2. The method according to claim 1, wherein the digital control signal comprises the filtered phase difference signal.

3. The method according to claim 1, wherein step c) further comprises changing, as a function of the digital control signal, at least one of a group consisting of a capacitance of a resonant circuit of the digitally controlled oscillator and an inductance of the resonant circuit of the digitally controlled oscillator.

4. The method according to claim 3, wherein the digital control signal is a binary coded signal and wherein step c) further comprises:
    converting at least part of the digital control signal into a thermometer-coded control signal;
    selectively activating a plurality of changeable capacitances using the thermometer-coded control signal to set the capacitance of the digitally controlled oscillator.

5. The method according to claim 1, further comprising modulating the frequency of the clock signal by modulating of the digital control signal.

6. The method according to claim 5, further comprising modulating the frequency of the clock signal with a modulating frequency that is substantially less than the frequency of the clock signal such that the frequency of the clock signal changes by at most 1%.

7. The method according to claim 1, wherein the filtered phase difference signal has a proportional component and an integral component.

8. The method according to claim 7, further comprising using the proportional component of the filtered phase difference signal to control the digitally controlled oscillator.

9. The method according to claim 8, further comprising adjusting a weighting factor of the integral component and/or a weighting factor of the proportional component.

10. The method according to claim 1, wherein the phase difference signal is a signal which can adopt two possible values.

11. The method according to claim 1, wherein step a) further comprises decimating the reference clock signal.

12. The method according to claim 1, wherein step a) further comprises decimating the phase difference signal.

13. The method according to claim 11, wherein step a) further comprises selectively decimating the reference clock signal depending on a frequency of the reference clock signal.

14. The method according to claim 1, wherein the frequency of the clock signal is greater than 1 GHz.

15. A method for generating a clock signal. comprising:
    a) forming a phase difference signal based at least in part on a phase difference between a reference clock signal and a feedback signal derived from the clock signal;
    b) digitally filtering the phase difference signal in order to form a filtered phase difference signal,
    c) controlling a digitally controlled oscillator to generate the clock signal at least in part using a digital control signal, the digital control signal dependent on the filtered phase difference signal, and
    d) forming a frequency difference signal depending on a frequency difference between the reference clock signal and the feedback signal, and wherein step c) further comprises controlling the digitally controlled oscillator as a function of the frequency difference signal.

16. The method according to claim 15, wherein the digitally controlled oscillator is controlled by a further digital control signal that is dependent on the digital frequency difference signal.

17. The method according to claim 15, wherein step c) further comprises generating the digital control signal by combining the frequency difference signal with one of the group consisting of the phase difference signal and the filtered phase difference signal.

18. The method according to claim 17 further comprising modulating the frequency difference signal in order to modulate the clock signal.

19. A device for generating a clock signal, comprising:
a phase detector configured to generate a phase difference signal as a function of a digital reference clock signal and a digital feedback signal derived from the clock signal,
a digital filter operably coupled to the phase detector and configured to filter the phase difference signal to form a filtered phase difference signal, and
a digitally controlled oscillator operably coupled to the digital filter and operable to generate the clock signal as a function of a digital control signal that corresponds to the filtered phase difference signal.

20. The device according to claim 19, wherein the digitally controlled oscillator includes a resonant circuit with an inductance and a capacitance, and wherein the inductance and/or the capacitance can be changed as a function of the digital control signal.

21. The device according to claim 20, wherein the digital control signal is a binary coded signal, and wherein the digitally controlled oscillator includes:
a thermometer coder configured to convert the digital control signal into a thermometer-coded control signal; and
a plurality of switchable capacitances configured to be selectively activated by the thermometer-coded control signal.

22. The device according to claim 19, wherein the phase detector is configured to generate the phase difference signal such that the phase difference signal has two possible states.

23. The device according to claim 22, wherein the phase detector includes an intermediate storage device having a data input and a clock input, the data input and clock input operably coupled to receive the reference clock signal and the feedback signal.

24. The device according to claim 23, wherein the intermediate storage device comprises a flip-flop device.

25. The device according to claim 20, further comprising a modulation device coupled to receive a modulation signal, the modulation device configured to modulate a signal that controls the digitally controlled oscillator in dependence on the modulation signal.

26. The device according to claim 20, wherein the digital filter and/or the digitally controlled oscillator includes a clock input configured to receive a clock signal, and further comprising a clock changeover switch configured to selectively provide as the clock signal one of the group consisting of the reference clock signal and the feedback signal.

27. The device according to claim 20, further comprising means for reducing a scanning rate of signals to be processed in the device.

28. The device according to claim 27, further comprising an activation circuit configured to selectively activate the means for reducing the scanning rate.

29. A device for generating a clock signal, comprising:
a phase detector configured to generate a phase difference signal as a function of a reference clock signal and a feedback signal derived from the clock signal,
a digital filter operably coupled to the phase detector and configured to filter the phase difference signal to form a filtered phase difference signal,
a digitally controlled oscillator operably coupled to the digital filter and operable to generate the clock signal as a function of a digital control signal that corresponds to the filtered phase difference signal, and
a frequency detector configured to generate a frequency difference signal as a function of a frequency difference between the reference clock signal and the feedback signal, and wherein the digitally controlled oscillator is configured to generate the clock signal as a function of the frequency difference signal.

30. The device according to claim 29, wherein the frequency detector comprises:
a first integrator configured to receive the reference clock signal;
a second integrator configured to receive the feedback signal; and
a summation unit operably coupled to receive an output signal of the first integrator and an output signal of the second integrator, the summation unit operable to generate the frequency difference signal as a function of a difference between the output signal of the first integrator and the output signal of the second integrator.

31. A method for generating a clock signal, comprising:
a) forming a phase difference signal based at least in part on a phase difference between a reference clock signal and a feedback signal derived from the clock signal;
b) digitally filtering the phase difference signal in order to form a proportional component signal and an integral component signal;
c) receiving the proportional component signal at a proportional control input of a digitally controlled oscillator; and
d) controlling the digitally controlled oscillator to generate the clock signal based on the proportional component signal.

32. A device for generating a clock signal, comprising:
a phase detector configured to generate a phase difference signal as a function of a reference clock signal and a feedback signal derived from the clock signal,
a digital filter operably coupled to the phase detector and configured to filter the phase difference signal to form a proportional component signal and an integral component signal; and
a digitally controlled oscillator configured to receive the proportional component signal and to generate the clock signal in accordance with the proportional component signal.

* * * * *